(12) United States Patent
Yoshikawa et al.

(10) Patent No.: US 12,029,058 B2
(45) Date of Patent: Jul. 2, 2024

(54) LIGHT EMITTING ELEMENT AND DISPLAY DEVICE USING SAME

(71) Applicant: SHARP KABUSHIKI KAISHA, Sakai (JP)

(72) Inventors: Hirofumi Yoshikawa, Sakai (JP); Tatsuya Ryohwa, Sakai (JP); Masaki Yamamoto, Sakai (JP); Takahiro Doe, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 534 days.

(21) Appl. No.: 17/434,867

(22) PCT Filed: Mar. 11, 2019

(86) PCT No.: PCT/JP2019/009797
§ 371 (c)(1),
(2) Date: Aug. 30, 2021

(87) PCT Pub. No.: WO2020/183586
PCT Pub. Date: Sep. 17, 2020

(65) Prior Publication Data
US 2022/0165973 A1      May 26, 2022

(51) Int. Cl.
*H01L 27/15* (2006.01)
*C09K 11/02* (2006.01)
(Continued)

(52) U.S. Cl.
CPC .......... *H10K 50/115* (2023.02); *C09K 11/025* (2013.01); *C09K 11/0883* (2013.01);
(Continued)

(58) Field of Classification Search
CPC ... H01L 33/04; H01L 27/156; H01L 33/0062; H01L 33/30; H01L 25/0753; H01L 33/06; H01L 33/002; H01L 33/486
See application file for complete search history.

(56) References Cited

U.S. PATENT DOCUMENTS

2013/0214249 A1      8/2013  Pan et al.
2017/0373230 A1*   12/2017  Pickett .................. H01L 33/502
(Continued)

FOREIGN PATENT DOCUMENTS

| JP | 2013-251282 A | 12/2013 |
| JP | 2016-197601 A | 11/2016 |
| JP | 2019-033005 A | 2/2019 |

OTHER PUBLICATIONS

O.B. Shchekin et al., "1.3 μm InAs quantum dot laser with To=161 K from 0 to 80 ° C", Applied Physics Letters, vol. 80, No. 18, May 6, 2002, pp. 3277-3279.
(Continued)

*Primary Examiner* — Samuel Park
(74) *Attorney, Agent, or Firm* — ScienBiziP, P.C.

(57) ABSTRACT

A light-emitting element includes: an anode electrode configured to supply holes; a cathode electrode configured to supply electrons; and a light-emitting layer disposed between the anode electrode and the cathode electrode. The light-emitting layer includes a plurality of quantum dot phosphors configured to emit light in conjunction with combining of holes supplied from the anode electrode and electrons supplied from the cathode electrode and a p-type dopant.

12 Claims, 6 Drawing Sheets

(51) Int. Cl.
*C09K 11/08* (2006.01)
*C09K 11/70* (2006.01)
*C09K 11/88* (2006.01)
*H10K 50/115* (2023.01)
*B82Y 20/00* (2011.01)
*B82Y 40/00* (2011.01)

(52) U.S. Cl.
CPC .......... *C09K 11/703* (2013.01); *C09K 11/883* (2013.01); *B82Y 20/00* (2013.01); *B82Y 40/00* (2013.01)

(56) References Cited

U.S. PATENT DOCUMENTS

| | | | |
|---|---|---|---|
| 2019/0115507 A1* | 4/2019 | Kim | H10K 50/82 |
| 2019/0163016 A1* | 5/2019 | Kim | H01L 33/502 |
| 2019/0257003 A1* | 8/2019 | Kim | H01L 33/28 |

OTHER PUBLICATIONS

Tong-Tong Xuan et al., "Microwave-Assisted Synthesis of CdS/ZnS:Cu Quantum Dots for White Light-Emitting Diodes with High Color Rendition", Chemistry of Materials, Feb. 2, 2015, 27, pp. 1187-1193.

* cited by examiner

LIGHT EMITTING ELEMENT AND DISPLAY DEVICE USING SAME

TECHNICAL FIELD

The disclosure relates to a light-emitting element and a display device using the same.

BACKGROUND ART

In the light-emitting element provided with a light-emitting layer between an anode electrode and a cathode electrode, the effective mass of the holes is heavier than that of the electrons, so the quantum levels of the valence band approach one another, and the carriers (holes) decrease due to thermal excitation. As a result, the expected optical gain is not obtained with a quantum dot laser made via epitaxial crystal growth. Thus, the carrier is compensated for by p-type modulation doping, and as a result, an improvement in optical gain and an improvement in operating temperature are obtained (NPL 1).

CITATION LIST

Non Patent Literature

NPL 1: O. B. Shchekin, D. G. Deppe, "1.3 μm InAs quantum dot laser with T0=161 K from 0 to 80° C.", Applied Physics Letters Vol. 80, 3277 year 2002

SUMMARY

Technical Problem

Even in quantum dots used in application type QLED (quantum dot light emitting diodes) manufactured by a solvolysis method, because the effective mass of the holes is heavier than electrons, the quantum levels of the valence band is in close proximity, and the carriers (holes) decreases due to thermal excitation. As a result, the expected optical gain (luminous efficiency) is not obtained.

However, since the manufacturing method using the solvolysis method of the application type QLED differs from the manufacturing method using epitaxial growth, there is a problem that p-type modulation doping similar to that in NPL 1 cannot be performed.

An aspect of the disclosure aims to improve the performance of QLED compared with related art.

Solution to Problem

A light-emitting element according to an aspect of the disclosure includes an anode electrode configured to supply holes, a cathode electrode configured to supply electrons, and a light-emitting layer disposed between the anode electrode and the cathode electrode, wherein the light-emitting layer includes a plurality of quantum dot phosphors configured to emit light in conjunction with combining of holes supplied from the anode electrode and electrons supplied from the cathode electrode and a p-type dopant configured to compensate for the holes supplied from the anode electrode.

A display device according to an aspect of the disclosure includes the light-emitting element according to an aspect of the disclosure and a base material for installing the light-emitting element.

Advantageous Effects of Disclosure

An aspect of the disclosure aims to improve the performance of QLED compared with related art.

DESCRIPTION OF EMBODIMENTS

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

First Embodiment

Figure 1:
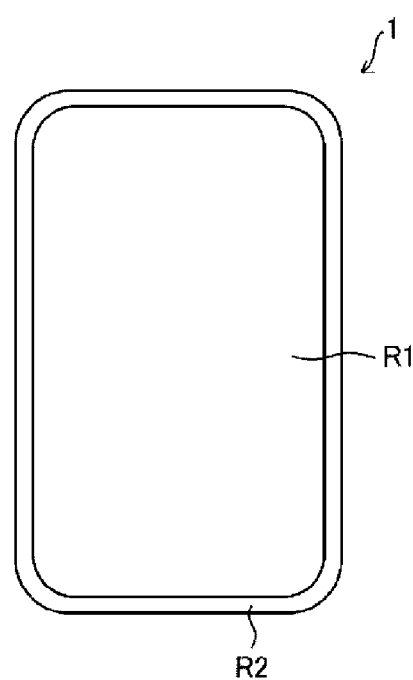
FIG. 1 is a diagram of a display device according to a first embodiment.

FIG. 1 is a diagram of a display device 1 according to the first embodiment. The display device 1 uses a small panel of a mobile device such as a smart phone and includes a display region R1 in which a plurality of display pixels D are formed in a matrix-like arrangement and a frame region R2 disposed around the display region R1.

Figure 2:
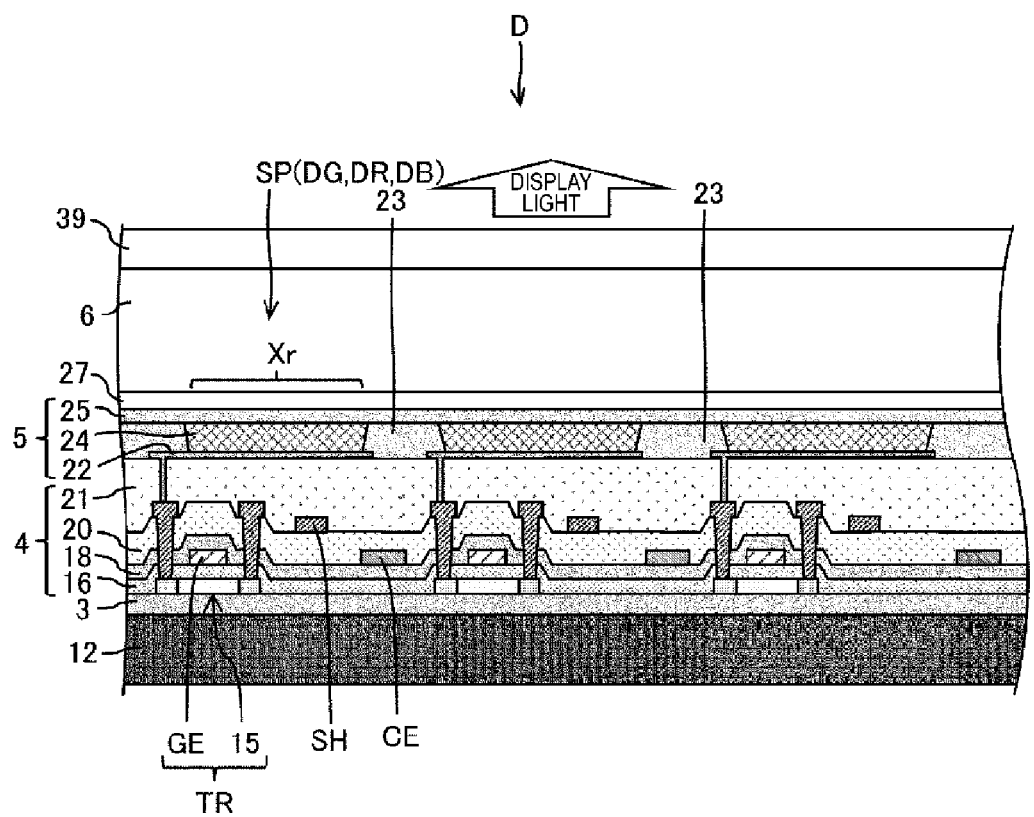
FIG. 2 is a cross-sectional view of a display pixel provided in the display device.
Figure 3:
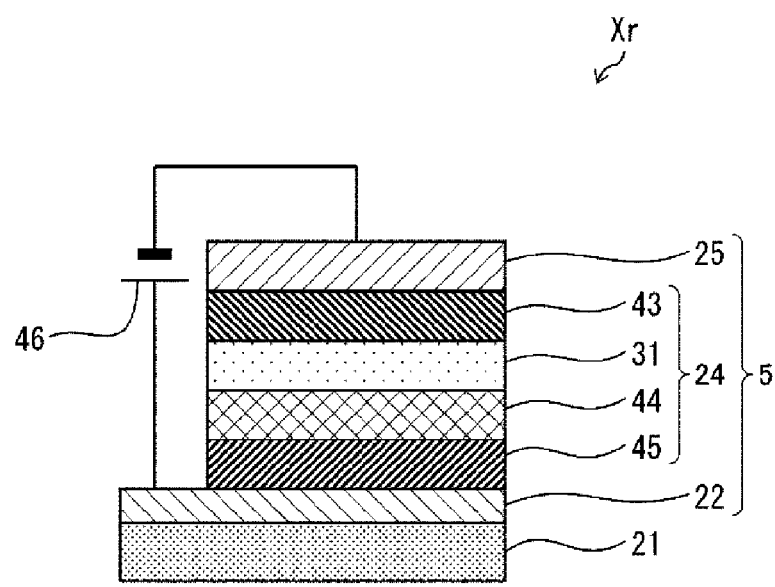
FIG. 3 is a cross-sectional view of a light-emitting element provided in the display pixel.

FIG. 2 is a cross-sectional view of the display pixel D provided in the display region R1 of the display device 1. FIG. 3 is a cross-sectional view of a light-emitting element Xi provided in the display pixel D.

A substrate 12 may be a glass substrate or a flexible substrate including a resin film such as polyimide. A flexible substrate can also be formed by sandwiching an inorganic insulating film with two resin films. A film made of PET or the like may be applied to the lower surface of the substrate 12. By using a flexible substrate as the substrate 12, a (flexible) display device 1 with flexibility can be formed.

The barrier layer 3 is a layer that inhibits foreign matter such as water and oxygen from entering the TFT layer 4 and the light-emitting element layer 5, and can be constituted by a silicon oxide film, a silicon nitride film, or a silicon oxynitride film, or by a layered film of these, formed by chemical vapor deposition (CND).

As illustrated in FIG. 2, a thin film transistor (TFT) layer 4 includes a first metal layer (including a gate electrode GE)

as an upper layer overlying a barrier layer 3, an inorganic insulating film 16 (a gate insulating film) as an lower layer overlying the first metal layer, a semiconductor layer (including a semiconductor film 15) as a lower layer overlying the inorganic insulating film 16, an inorganic insulating film 18 as an upper layer overlying the semiconductor layer, a second metal layer (including a capacitance electrode CE) as an upper layer overlying the inorganic insulating film 18, an inorganic insulating film 20 as an upper layer overlying the second metal layer, a third metal layer (including a source wiring line SH) as an upper layer overlying the inorganic insulating film 20, and an organic flattening film 21 (resin film) as an upper layer overlying the third metal layer.

The semiconductor layer includes, for example, amorphous silicon, low-temperature polysilicon (LTPS), or an oxide semiconductor, and a thin film transistor TR is configured to include the gate electrode GE and the semiconductor film 15. The thin film transistor TR in the diagram is a bottom gate structure, but may be a top gate structure.

The display pixel D is provided with the light-emitting element Xr for each subpixel SP (DG, DR, DB) and a control circuit, and in the TFT layer 4, the control circuit and a wiring line that connects thereto is formed. The control circuit includes a drive transistor that controls the current of the light-emitting element Xr, a write transistor that electrically connects to a scanning signal line, a light emission control transistor that electrically connects to a light emission control line, and the like.

The first metal layer, the second metal layer, and the third metal layer are each formed of a single layer film or a multi-layer film of metal, the metal including at least one of aluminum, tungsten, molybdenum, tantalum, chromium, titanium, and copper, for example.

Each of the inorganic insulating films 16, 18, and 20 can be formed of, for example, a silicon oxide (SiOx) film or a silicon nitride (SiNx) film, or a layered film of these, formed by using a CVD method. The organic flattening film 21 can be formed of, for example, a coatable organic material such as polyimide or acrylic resin.

The light-emitting element layer 5 includes a first electrode (anode electrode) 22 which is an upper layer overlying the organic flattening film 21, an insulating edge cover film 23 (edge cover) that covers an edge of the first electrode 22, an electroluminescent (EL) layer 24 which is an upper layer overlying the edge cover film 23, a second electrode (cathode electrode) 25 which is an upper layer overlying the EL layer 24, and a cap layer 27 which is an upper layer overlying the second electrode 25. The edge cover film 23 is formed by applying an organic material such as a polyimide or an acrylic resin and then patterning the organic material by photolithography, for example.

A plurality of the light-emitting elements Xr are formed in the light-emitting element layer 5, and each of the light-emitting elements Xr includes the island-shaped first electrode 22, the EL layer 24, and the second electrode 25. The second electrode 25 is a solid-like common electrode common to the plurality of light-emitting elements Xr.

Each of the light-emitting elements Xr is a quantum dot light-emitting diode (QLED) including a quantum dot layer as the light-emitting layer 31.

For example, as illustrated in FIG. 3, the EL layer 24 is formed by layering a hole injection layer (HIL) 45, a hole transport layer (HTL) 44, a light-emitting layer 31, an electron transport layer (ETL) 43, and an electron injection layer (not illustrated) in this order, from the lower layer side. The light-emitting layer 31 is formed into an island shape at an opening (each subpixel) of the edge cover film 23. Other layers are formed in an island shape or a solid-like shape (common layer). Note that a configuration is also possible in which one or more layers are not formed among the hole injection layer 45, the hole transport layer 44, the electron transport layer 43, and the electron injection layer. For example, the EL layer 24 may be formed by the hole transport layer 44, the light-emitting layer 31, and the electron transport layer 43, with the electron transport layer 43 being a common layer common to the plurality of light-emitting elements Xr. The first electrode 22 and the second electrode 25 can each be connected to a power supply 46.

The QLED quantum dot layer (light-emitting layer 31), for example, can be formed into an island-shaped quantum dot layer (corresponding to one subpixel) by applying a solution with quantum dots diffused in the solvent and performing patterning using a photolithography method.

The first electrode 22 (anode electrode) is made of layers of, for example, Indium Tin Oxide (ITO) and an alloy including silver (Ag) and has light reflectivity. The second electrode 25 (cathode electrode) is formed of a thin film of a magnesium silver alloy or the like and has optical transparency.

In a case where the light-emitting element Xr is a QLED, the holes and electrons recombine inside the light-emitting layer 31 in response to a drive current between the first electrode 22 and the second electrode 25, and light (fluorescence) is emitted when the excitons generated in this manner transition from the conduction band level of the quantum dot to the valence band level.

A sealing layer 6 is, for example, a light-transmitting barrier layer that includes an inorganic insulating film and an organic insulating film and prevents penetration of foreign matter, such as water and oxygen, into the light-emitting element layer 5.

The function film 39 has at least one of an optical compensation function, a touch sensor function, and a protection function, for example.

Figure 4:
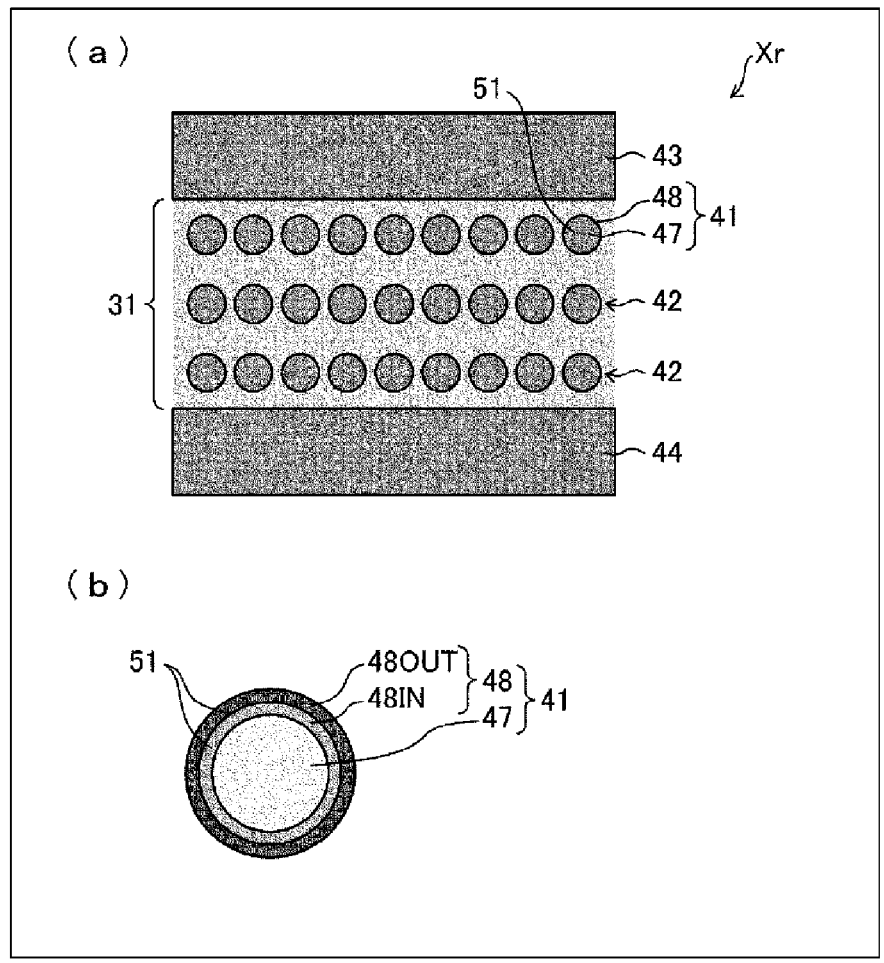
FIG. 4 illustrates cross-sectional views in which (a) is a cross-sectional view focused on the light-emitting layer formed in the light-emitting element, and (b) is a cross-sectional view illustrating the configuration of a core-shell quantum dot phosphor provided in the light-emitting layer.

FIG. 4(a) is a cross-sectional view focused on the light-emitting layer 31 formed in the light-emitting element Xr, and FIG. 4(b) is a cross-sectional view illustrating the configuration of a core-shell quantum dot phosphor 41 provided in the light-emitting layer 31. The light-emitting layer 31 includes a plurality of core-shell quantum dot phosphors 41 that emit light in conjunction with the combining of the holes supplied from the first electrode 22 and the electrons supplied from the second electrode 25.

As illustrated in FIG. 4(b), a core-shell quantum dot phosphor 41 includes a core 47 and a shell 48 formed around the core 47. The shell 48 includes an internally formed inner portion 48IN and an externally outer portion 48 OUT. Note that although not illustrated, a modifying group protecting the core-shell quantum dot phosphor 41 may be located on the surface of the shell 48.

The light-emitting layer 31 further includes z p-type dopant 51 to compensate for holes supplied from the first electrode 22. The p-type dopant 51 includes Cu or Ag and is disposed within the shell 48 of each core-shell quantum dot phosphor 41. The p-type dopant 51 is preferably disposed more on the outer side 48OUT on the opposite side from the core 47 from the inner portion 48IN of the core 47 side, of the shell 48. Shell 48 includes ZnS.

A quantum dot layer 42 is formed by a portion of a plurality of core-shell quantum dot phosphors 41, and another quantum dot layer 42 is formed by another portion of the plurality of core-shell quantum dot phosphors 41.

The light-emitting layer 31 configured in this manner is manufactured as follows. First, upon shell synthesis of the core-shell quantum dot phosphor 41, the ZnS of the shell 48 of the core-shell quantum dot phosphor 41 is p-type doped with Cu and Ag. The p-type doping concentration is, for example, from $1 \times 10^{18}$ cm$^{-3}$ to $5 \times 10^{18}$ cm$^{-3}$. Next, a liquid composition is prepared by adding into a solvent the core-shell quantum dot phosphor 41 with a shell 48 that has been p-type doped with Cu and Ag. The liquid composition is then applied to the top surface of the hole transport layer 44 to form a coating film of the liquid composition. Next, the solvent of the liquid composition is evaporated by naturally drying the coating film, for example. In this manner, the coating film is solidified (cured). As a result, the light-emitting layer 31 including the core-shell quantum dot phosphor 41 with a Cu and Ag p-type dopant 51 disposed on the shell 48 is formed. Note that the p-type doping concentration may be inclined toward the shell 48 layer. For example, the core 47 side of the shell 48 may have a lower p-type doping concentration, and the shell 48 side opposite the core 47 may have a higher p-type doping concentration. This aspect with an inclined p-type doping concentration can be adjusted by the concentration of the doping material when synthesizing the shell 48.

Since the thickness of the shell 48 of the core-shell quantum dot phosphor 41 is several nm, the distance of the p-type dopant 51 disposed in the shell 48 to the core 47 is less than the distance to the quantum dots of the dopant described in the epitaxial growth of NPL 1.

In this manner, the Cu and Ag p-type dopant 51 is disposed in the shell 48 of the core-shell quantum dot phosphor 41. The p-type dopant 51 of the shell 48 provides holes contributing to light emission and increases the density of the holes. Accordingly, the hole supplied from the first electrode 22 is compensated for by the p-type dopant 51 of the shell 48. As a result, the luminous efficiency of the light-emitting element Xr is improved.

Note that the core-shell quantum dot phosphor 41, the electron transport layer 43, and the hole transport layer 44 are constituted by, for example, the following materials. The core-shell quantum dot phosphor 41 may be constituted by, for example, a semiconductor material formed of an element of at least one type selected from the group consisting of cadmium (Cd), sulfur (S), tellurium (Te), selenium (Se), zinc (Zn), indium (In), nitrogen (N), phosphorus (P), arsenic (As), antimony (Sb), aluminum (Al), gallium (Ga), lead (Pb), silicon (Si), germanium (Ge), and magnesium (Mg); and may be a CdSe/ZnS quantum dot phosphor, a CdSe/CdS quantum dot phosphor an InP/ZnS quantum dot phosphor, or the like.

The electron transport layer 43 may be constituted by, for example, zinc oxide (ZnO), titanium oxide (TiO$_2$), magnesium zinc oxide (MgZnO), tantalum oxide (Ta$_2$O$_3$), and strontium titanium oxide (SrTiO$_3$), and the like.

For example, the hole transport layer 44 may include an inorganic material such as nickel oxide (NiO) and molybdenum oxide (MoO$_3$), and may be constituted by polyethylene dioxythiophene (PEDOT), poly(3, 4-ethylene dioxythiophene)-poly (styrenesulfonic acid) (PEDOT-PSS), 4,4'-bis[N-phenyl-N-(3"-methylphenyl)amino]biphenyl (TPD), poly(N-vinylcarbazoie) (PVK), poly[(9,9-dyoctyl fluorenyl-2,7-diyl)-co-(4,4'-(N-(4-sec-butylphenyl))diphenylamine)] (TFB), 4,4'-bis(9-carbazolyl)-biphenyl (CBP), and N,N'-di-[(1-naphthyl)-N, N'-diphenyl]-(1,1'-biphenyl)-4,4'-diamine (NPD).

Second Embodiment

Figure 5:
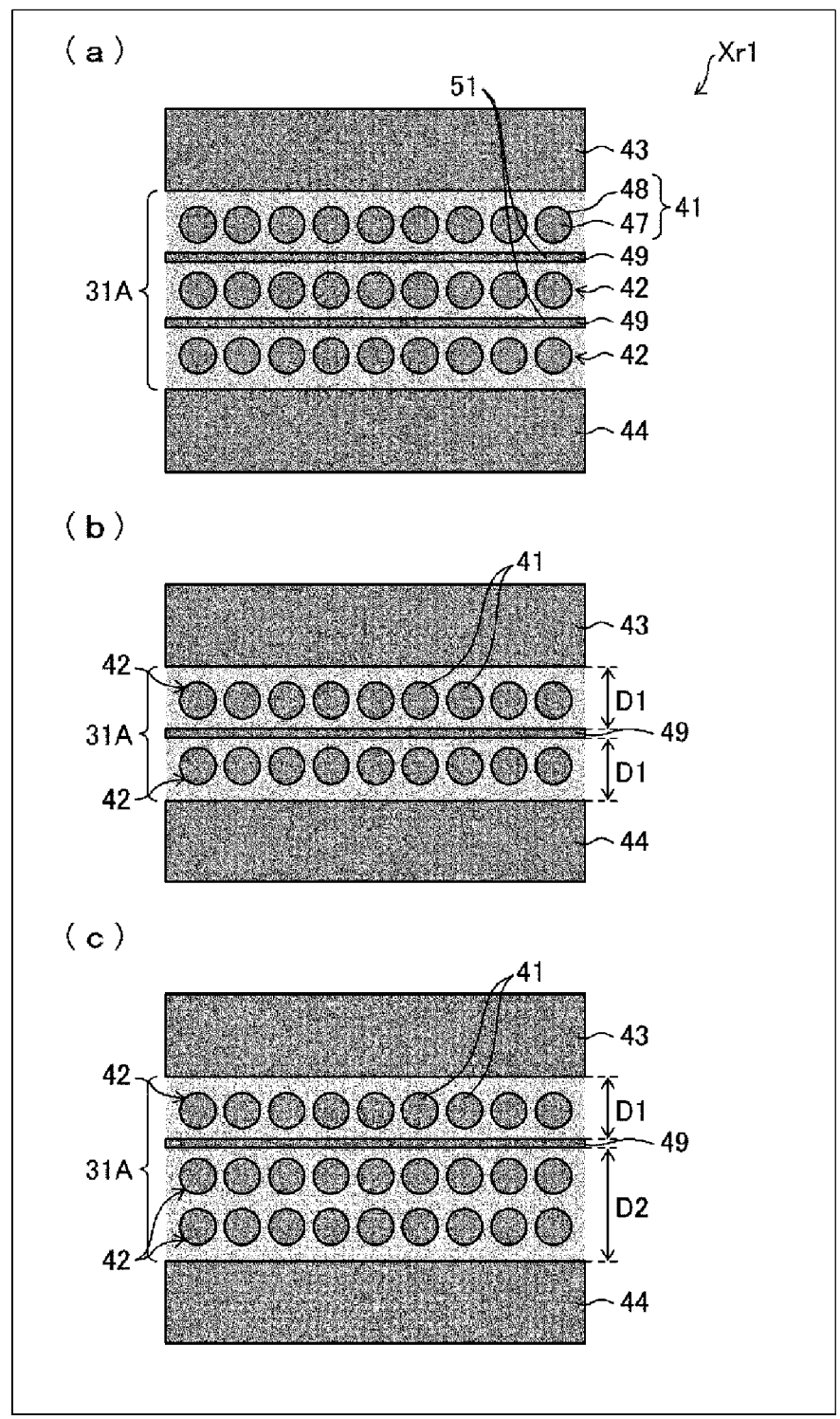
FIG. 5 illustrates cross-sectional views in which (a) is a cross-sectional view focused on a light-emitting layer according to a second embodiment, (b) is a cross-sectional view illustrating a modified example of the light-emitting layer, and (c) is a cross-sectional view illustrating another modified example of the light-emitting layer.

FIG. 5(a) is a cross-sectional view focused on a light-emitting layer 31A formed in a light-emitting element Xr1 according to the second embodiment. Constituent elements similar to the constituent elements described above are given the same reference numerals, and detailed descriptions thereof are not repeated.

In the light-emitting layer 31A, a quantum dot layer 42 is formed by a portion of a plurality of core-shell quantum dot phosphors 41 (a first quantum dot layer), and another quantum dot layer 42 is formed by another portion of the plurality of core-shell quantum dot phosphors 41 (second quantum dot layer). A p-type dopant layer 49 formed by the p-type dopant 51 is disposed between the quantum dot layer 42 and the other quantum dot layer 42. The p-type dopant layer 49 includes ZnS, and the p-type dopant 51 of the p-type dopant layer 49 includes Cu or Ag.

FIG. 5(b) is a cross-sectional view illustrating a modified example of the light-emitting layer 31A, and FIG. 5(c) is a cross-sectional view illustrating another modified example of the light-emitting layer 31A. Constituent elements similar to the constituent elements described above are given the same reference numerals, and detailed descriptions thereof are not repeated.

It is sufficient that two or more layers of the quantum dot layer 42 be provided, and it is sufficient that one or more p-type dopant layers 49 be provided. For example, as illustrated in FIG. 5(b), two quantum dot layers 42 and one p-type dopant layer 49 may be provided. As illustrated in FIG. 5(a), three quantum dot layers 42 and two p-type dopant layers 49 may be provided.

Furthermore, as illustrated in FIG. 5(c), three quantum dot layers 42 and one p-type dopant layer 49 may be provided. In this case, as illustrated in FIG. 5(c), two quantum dot layers 42 are formed on the anode electrode side of the p-type dopant layer 49, and one quantum dot layer 42 is formed on the cathode electrode side of the p-type dopant layer 49. A film thickness D2 of the quantum dot layer 42 formed on the anode electrode side of the p-type dopant layer 49 is greater than a film thickness D1 of the quantum dot layer 42 formed on the cathode electrode side of the p-type dopant layer 49.

Also, the film thickness D2 of a first quantum dot layer may be greater than the film thickness D1 of a second quantum dot layer in a case in which there is a greater need to compensate for the holes in the quantum dot layer on the cathode electrode side and the configuration includes, from the anode electrode side, the first quantum dot layer and the second quantum dot layer. This allows for efficient hole compensation.

The core-shell quantum dot phosphor 41 includes the core 47 and the shell 48 formed around the core 47. The shell 48 comprises ZnS, Note that although not illustrated, a modifying group protecting the core-shell quantum dot phosphor 41 may be located on the surface of the shell 48.

In this manner, the p-type dopant layer 49 formed by the p-type doped p-type dopant 51 is inserted between the quantum dot layers 42, Specifically, a Cu or Ag p-type doped ZnS layer is applied as the p-type dopant layer 49 on the quantum dot layer 42. This p-type doped ZnS layer may be formed by sputtering, but is preferably formed by application to avoid sputter damage.

The light-emitting layer 31A configured in this manner is manufactured as follows. First, a liquid composition is prepared by adding into a solvent the core-shell quantum dot phosphor 41. The liquid composition is then applied to the top surface of the hole transport layer 44 to form a coating film of the liquid composition. Next, the solvent of the liquid composition is evaporated by naturally drying the coating film, for example. In this manner, the coating film is solidified (cured). As a result, the quantum dot layer 42 formed from the core-shell quantum dot phosphor 41 is formed on the upper surface of the hole transport layer 44.

Then, the p-type dopant layer 49 formed from the p-type dopant 51 is formed on the upper surface of the quantum dot layer 42 by an application method, sputtering, or the like. The p-type doping concentration is, for example, from $1\times10^{18}$ cm$^{-3}$ to $5\times10^{18}$ cm$^{-3}$. In a similar manner as described below, the quantum dot layer 42 and the p-type dopant layer 49 are formed multiple times in an alternating manner. The electron transport layer 43 is then formed on the upper surface of the quantum dot layer 42.

In this manner, the p-type dopant layer 49 including the Cu and Ag p-type dopant 51 is disposed between the quantum dot layers 42. The p-type dopant 51 of the p-type dopant layer 49 provides holes contributing to light emission and increases the density of the holes. Accordingly, the hole supplied from the first electrode 22 is compensated for by the p-type dopant 51 of the p-type dopant layer 49. As a result, the luminous efficiency of the light-emitting element Xr is improved.

The p-type dopant layer 49 is formed between the quantum dot layers 42, i.e., the p-type dopant layer 49 is formed within the light-emitting layer 31A. Thus, the p-type dopant layer 49 is not formed between the light-emitting layer 31A and the hole transport layer 44.

In the configuration according to the second embodiment, the p-type dopant 51 can be formed at a position distanced further from the core 47 of the core-shell quantum dot phosphor 41 than in the first embodiment. For this reason, the p-type dopant 51 obtained by p-type doping can be disposed in a more appropriate position. This is because when the position of the p-type dopant 51 is close to the core 47, it may lead to a decrease in crystal quality near the core 47, i.e., the light-emitting region, and when the position of the p-type dopant 51 is too far from the core 47, the hole supply efficiency may decrease. The p-type dopant 51 is disposed at a position distanced from the core 47 of the core-shell quantum dot phosphor 41 by, for example, 6 nm.

The configuration of the second embodiment for forming the p-type dopant layer 49 has improved freedom of design in terms of the distance between the p-type dopant 51 and the core-shell quantum dot phosphor 41 compared to the configuration of the first embodiment which includes the core-shell quantum dot phosphor 41 in which the p-type dopant 51 is positioned in the shell 48.

Third Embodiment

Figure 6:
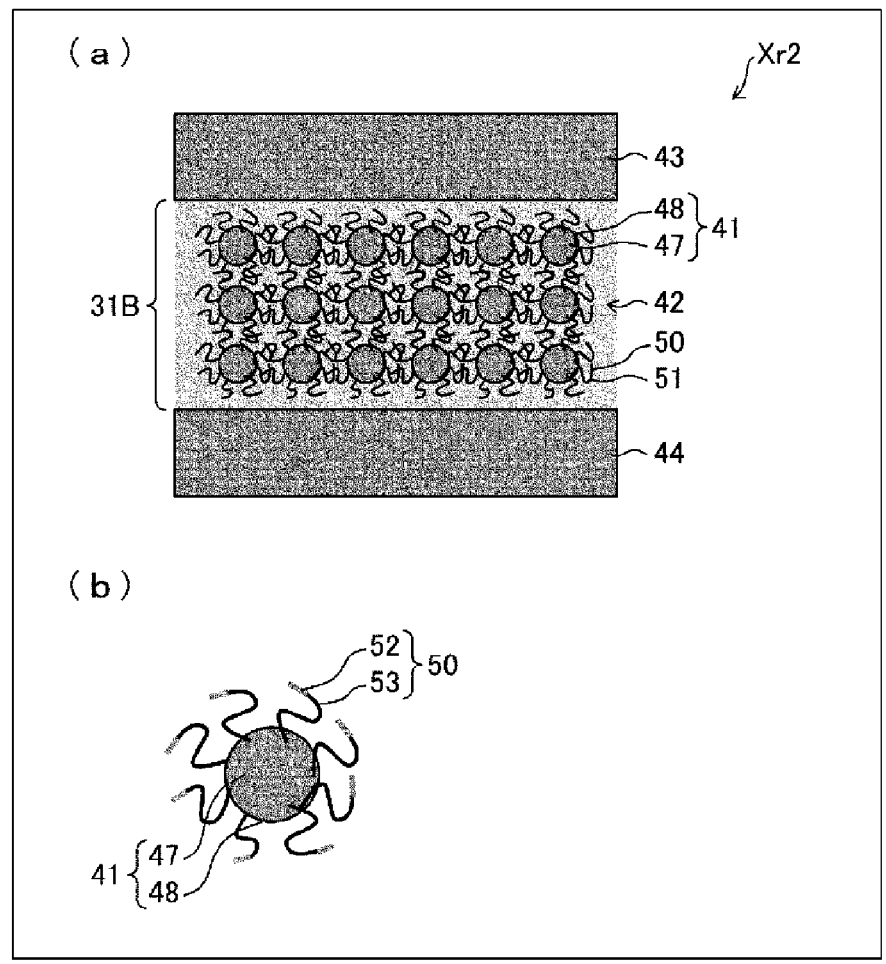
FIG. 6 illustrates cross-sectional views in which (a) is a cross-sectional view focused on a light-emitting layer according to a third embodiment, and (b) is a cross-sectional view illustrating the configuration of a quantum dot phosphor provided in the light-emitting layer.

FIG. 6(*a*) is a cross-sectional view focused on a light-emitting layer 31B according to the third embodiment, and FIG. 6(*b*) is a cross-sectional view illustrating the configuration of a quantum dot phosphor 41A provided in the light-emitting layer 31B. Constituent elements similar to the constituent elements described above are given the same reference numerals, and detailed descriptions thereof are not repeated.

The quantum dot phosphor 41A includes the core 47, the shell 48 formed around the core 47, and a modifying group 50 that protects the quantum dot phosphor 41A. The modifying group 50 includes an end portion 52 formed from a p-type organic semiconductor disposed on the opposite side of the modifying group 50 from the core 47 and a base portion 53 formed from a material other than a p-type organic semiconductor disposed on the core 47 side of the modifying group 50.

A quantum dot layer 42 is formed by a portion of a plurality of the quantum dot phosphors 41A, and another quantum dot layer 42 is formed by another portion of the plurality of the quantum dot phosphors 41A.

The light-emitting layer 31B configured in this manner is manufactured as follows. First, the core-shell quantum dot phosphor 41 is added into a solvent. Subsequently, the modifying group 50 with a portion formed by a p-type organic semiconductor is further added to the solvent. For example, the modifying group 50 bonded with a p-type organic semiconductor of poly(3-hexylthiophene-2,5-diyl) (P3HT) is added. The modifying group 50 function as a dispersing agent allowing the core-shell quantum dot phosphor 41 to be effectively dispersed in the solvent. The liquid composition is then applied to the top surface of the hole transport layer 44 to form a coating film of the liquid composition. Next, the solvent of the liquid composition is evaporated by naturally drying the coating film, for example. In this manner, the coating film is solidified (cured). As a result, the light-emitting layer 31B including the core-shell quantum dot phosphor 41 and the modification group 50 with a portion formed by a p-type organic semiconductor is formed.

Supplement

A light-emitting element of a first aspect includes:
an anode electrode configured to supply holes;
a cathode electrode configured to supply electrons; and
a light-emitting layer disposed between the anode electrode and the cathode electrode,
wherein the light-emitting layer includes a plurality of quantum dot phosphors configured to emit light in conjunction with combining of holes supplied from the anode electrode and electrons supplied from the cathode electrode and a p-type dopant.

In a second aspect, the quantum dot phosphor is a core-shell quantum dot phosphor including a core and a shell formed around the core, and
the p-type dopant is disposed on the shell.

In a third aspect, the shell includes ZnS, and
the p-type dopant includes Cu or Ag.

In a fourth aspect, more of the p-type dopant is disposed on a side of the shell opposite the core than on the core side.

In a fifth aspect, a first quantum dot layer is formed by a portion of the plurality of quantum dot phosphors,
a second quantum dot layer is formed by another portion of the plurality of quantum dot phosphors, and
a p-type dopant layer formed by the p-type dopant is disposed between the first quantum dot layer and the second quantum dot layer.

In a sixth aspect, from the anode electrode side, the first quantum dot layer and the second quantum dot layer are formed, and
a film thickness of the first quantum dot layer is greater than a film thickness of the second quantum dot layer.

In a seventh aspect, the p-type dopant layer includes ZnS, and
the p-type dopant of the p-type dopant layer includes Cu or Ag.

In an eighth aspect, the quantum dot phosphor is a core-shell quantum dot phosphor including a core and a shell formed around the core, and
the shell includes ZnS.

In a ninth aspect, the quantum dot phosphor further includes a modifying group configured to protect the quantum dot phosphor, and a p-type organic semiconductor is disposed within the modifying group.

In a tenth aspect, more of the p-type organic semiconductor is disposed on a side opposite the quantum dot phosphor within the modifying group.

In an eleventh aspect, the quantum dot phosphor is a core-shell quantum dot phosphor including a core, a shell formed around the core, and a modifying group disposed around the shell.

In a twelfth aspect, a p-type doping concentration of the p-type dopant is from $1\times10^{18}$ cm$^{-3}$ to $5\times10^{18}$ cm$^{-3}$.

A display device of a thirteenth aspect includes:
the light-emitting element according to any one of first to twelfth aspect; and
a base material for installing the light-emitting element.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A light-emitting element, comprising:
an anode electrode configured to supply holes;
a cathode electrode configured to supply electrons; and
a light-emitting layer disposed between the anode electrode and the cathode electrode,
the light-emitting layer includes a plurality of quantum dot phosphors configured to emit light in conjunction with combining of holes supplied from the anode electrode and electrons supplied from the cathode electrode and a p-type dopant;
wherein a first quantum dot layer is formed by a portion of the plurality of quantum dot phosphors,
a second quantum dot layer is formed by another portion of the plurality of quantum dot phosphors, and
a p-type dopant layer formed by the p-type dopant is disposed between the first quantum dot layer and the second quantum dot layer.

2. The light-emitting element according to claim 1,
wherein the quantum dot phosphor is a core-shell quantum dot phosphor including a core and a shell formed around the core, and
the p-type dopant is disposed on the shell.

3. The light-emitting element according to claim 2,
wherein the shell includes ZnS, and
the p-type dopant includes Cu or Ag.

4. The light-emitting element according to claim 3,
wherein more of the p-type dopant is disposed on a side of the shell further from the core than on the core side.

5. The light-emitting element according to claim 1,
wherein from the anode electrode side, the first quantum dot layer and the second quantum dot layer are formed, and
a film thickness of the first quantum dot layer is greater than a film thickness of the second quantum dot layer.

6. The light-emitting element according to claim 5,
wherein the p-type dopant layer includes ZnS, and
the p-type dopant of the p-type dopant layer includes Cu or Ag.

7. The light-emitting element according to claim 6,
wherein the quantum dot phosphor is a core-shell quantum dot phosphor including a core and a shell formed around the core, and
the shell includes ZnS.

8. The light-emitting element according to claim 1,
wherein the quantum dot phosphor further includes a modifying group configured to protect the quantum dot phosphor, and
a p-type organic semiconductor is disposed within the modifying group.

9. The light-emitting element according to claim 8,
wherein more of the p-type organic semiconductor is disposed on a side further from the quantum dot phosphor within the modifying group.

10. The light-emitting element according to claim 8,
wherein the quantum dot phosphor is a core-shell quantum dot phosphor including a core, a shell formed around the core, and the modifying group disposed around the shell.

11. The light-emitting element according to claim 1,
wherein a p-type doping concentration of the p-type dopant is from $1\times10^{18}$ cm$^{-3}$ to $5\times10^{18}$ cm$^{-3}$.

12. A display device, comprising:
the light-emitting element according to claim 1; and
a base material for installing the light-emitting element.

* * * * *